(12) United States Patent
Rhee et al.

(10) Patent No.: US 7,852,121 B2
(45) Date of Patent: Dec. 14, 2010

(54) DOMINO LOGIC CIRCUIT AND PIPELINED DOMINO LOGIC CIRCUIT

(75) Inventors: Young-Chul Rhee, Yongin-si (KR); Byung-Koan Kim, Suwon (KR); Ock-Chul Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/381,360

(22) Filed: Mar. 11, 2009

(65) Prior Publication Data
US 2009/0230994 A1   Sep. 17, 2009

(30) Foreign Application Priority Data
Mar. 11, 2008   (KR) ...................... 10-2008-0022317

(51) Int. Cl.
*H03K 19/00* (2006.01)
*H03K 19/096* (2006.01)

(52) U.S. Cl. ............................. 326/98; 326/93; 326/95

(58) Field of Classification Search ................... 326/93, 326/95, 98
See application file for complete search history.

(56) References Cited

U.S. PATENT DOCUMENTS

| | | | | |
|---|---|---|---|---|
| 4,700,086 A | * | 10/1987 | Ling et al. ..................... | 326/25 |
| 5,642,061 A | * | 6/1997 | Gorny ......................... | 326/97 |
| 5,646,557 A | * | 7/1997 | Runyon et al. ................. | 326/97 |
| 5,859,547 A | * | 1/1999 | Tran et al. ...................... | 326/98 |
| 6,184,718 B1 | * | 2/2001 | Tran et al. .................... | 326/121 |
| 6,404,235 B1 | * | 6/2002 | Nowka et al. .................. | 326/96 |
| 6,707,318 B2 | * | 3/2004 | Kumar et al. .................. | 326/98 |
| 6,794,903 B2 | * | 9/2004 | Kim et al. ..................... | 326/98 |
| 6,801,056 B2 | * | 10/2004 | Forbes .......................... | 326/95 |
| 2003/0184344 A1 | * | 10/2003 | Kumar et al. .................. | 326/98 |
| 2004/0008056 A1 | * | 1/2004 | Kursun et al. .................. | 326/96 |
| 2005/0040857 A1 | * | 2/2005 | Yoo .............................. | 326/95 |
| 2007/0176642 A1 | * | 8/2007 | Kursun et al. .................. | 326/98 |
| 2008/0048725 A1 | * | 2/2008 | Cheng .......................... | 326/98 |

FOREIGN PATENT DOCUMENTS

JP    2000-295095    10/2000

* cited by examiner

*Primary Examiner*—James H. Cho
*Assistant Examiner*—Matthew C Tabler
(74) *Attorney, Agent, or Firm*—Mills & Onello, LLP

(57) ABSTRACT

A domino logic circuit includes an input circuit and an output circuit. The input circuit precharges a dynamic node at a first phase of a clock signal. The input circuit determines a logic level of the dynamic node by performing a logic evaluation of input data at a second phase of the clock signal. The output circuit is coupled between an output node and the dynamic node. The output circuit determines a logic level of the output node in response to the clock signal and the logic level of the dynamic node. The output circuit maintains the logic level of the output node while the logic evaluation is performed.

18 Claims, 6 Drawing Sheets

DOMINO LOGIC CIRCUIT AND PIPELINED DOMINO LOGIC CIRCUIT

BACKGROUND

1. Technical Field

Example embodiments relate to a digital circuit, and more particularly to a domino logic circuit.

2. Description of the Related Art

Domino logic circuits are commonly used to reduce size and power consumption of a functional block in a circuit.

Various types of domino logic circuits include a domino logic circuit adopting a keeper transistor and a domino logic circuit adopting a limited switch dynamic logic (LSDL).

In the domino logic circuit adopting a keeper transistor, the resulting output signal has a tendency to transition in response to a clock signal when the clock signal transitions from a high level to a low level. Thus, the domino logic circuit can cause the accompanying circuit to malfunction when many domino logic circuits are serially coupled to each other and when the output signal needs to be maintained despite transition of the clock signal. Additionally, the domino logic circuit adopting a keeper transistor consumes more power because the output signal switches with every transition of the clock signal.

The LSDL type domino logic circuit is advantageous in that it can maintain the level of an output signal to prevent malfunction of the domino logic. However, the driving capacity of the LSDL-type domino logic circuit can be reduced since the LSDL-type domino logic circuit requires a relatively large number of transistors. Also, the LSDL-type domino logic circuit can result in an increase of power consumption and consume a relatively higher amount of circuit area.

SUMMARY

Accordingly, embodiments of the present invention are provided to substantially obviate one or more problems due to limitations and disadvantages of the related art.

Some example embodiments provide a domino logic circuit having a reduced current consumption. Some example embodiments provide a pipelined domino logic circuit capable of operating at a high speed with a reduced current consumption by being configured with a plurality of domino logic circuits coupled sequentially.

In some embodiments, a domino logic circuit includes an input circuit and an output circuit. The input circuit precharges a dynamic node at a first phase of a clock signal. The input circuit determines a logic level of the dynamic node by performing a logic evaluation of input data at a second phase of the clock signal. The output circuit is coupled between an output node and the dynamic node. The output circuit determines a logic level of the output node in response to the clock signal and the logic level of the dynamic node. The output circuit maintains the logic level of the output node while the logic evaluation is performed.

The input circuit may include a precharge transistor configured to precharge the dynamic node at the first phase of the clock signal, a logic network configured to receive the input data to determine the logic level of the dynamic node in response to a logic level of the input data, and a pull down transistor configured to enable or disable the logic network in response to the clock signal.

The precharge transistor may comprise a PMOS transistor having a source terminal coupled to a power supply voltage, a drain terminal coupled to the dynamic node, and a gate terminal receiving the clock signal, and the pull down transistor may comprise an NMOS transistor having a source terminal coupled to a ground voltage, a drain terminal coupled to the logic network, and a gate terminal receiving the clock signal.

The logic network may include a plurality of transistors. The plurality of transistors may be serially coupled to from a current path between the dynamic node and the pull down transistor. The plurality of the transistors may have control terminals receiving the input data.

The plurality of the transistors may be coupled in parallel to form current paths between the dynamic node and the pull down transistor. The plurality of the transistors may have control terminals receiving the input data.

The output circuit may include a cut-off transistor and an output maintaining circuit. The cut-off transistor may be coupled between the dynamic node and an intermediate node. The cut-off transistor may disconnect the dynamic node and the intermediate node at the first phase of the clock signal. The output maintaining circuit may maintain a logic level of the output node during a phase transition of the clock signal.

The cut-off transistor may have a first terminal coupled to the dynamic node, a second terminal coupled to the intermediate node, and a gate terminal receiving the clock signal.

The output maintaining circuit may include a first transistor, a second transistor, a third transistor and a fourth transistor. The first transistor may have a first terminal coupled to a power supply voltage, a second terminal coupled to the intermediate node, and a gate terminal coupled to the output node. The second transistor may have a first terminal coupled to the power supply voltage, a second terminal coupled to the output node, and a gate terminal coupled to the dynamic node. The third transistor may have a first terminal coupled to the output node, a second terminal coupled to a ground voltage, and a gate terminal coupled to the intermediate node. The fourth transistor may have a first terminal coupled to the power supply voltage, a second terminal coupled to the output node, and a gate terminal coupled to the intermediate node.

In some embodiments, a domino logic circuit includes a precharge transistor, a logic network, a pull down transistor, a cut-off transistor, a first transistor, a second transistor, a third transistor and a fourth transistor. The precharge transistor precharges a dynamic node at the first phase of a clock signal. The logic network is coupled to the dynamic node. The logic network determines a logic level of the dynamic node by performing a logic evaluation of input data. The pull down transistor is coupled between the logic network and a ground voltage to receive the clock signal. The cut-off transistor has a first terminal coupled to the dynamic node, a second terminal coupled to the intermediate node, and a gate terminal receiving the clock signal. The first transistor has a first terminal coupled to a power supply voltage, a second terminal coupled to the intermediate node, and a gate terminal coupled to an output node. The second transistor has a first terminal coupled to the power supply voltage, a second terminal coupled to the output node, and a gate terminal coupled to the dynamic node. The third transistor has a first terminal coupled to the output node, a second terminal coupled to the ground voltage, and a gate terminal coupled to the intermediate node. The fourth transistor has a first terminal coupled to the power supply voltage, a second terminal coupled to the output node, and a gate terminal coupled to the intermediate node.

A logic level of the output node may be maintained while the logic evaluation of the input data is performed.

In some embodiments, a pipelined domino logic circuit includes a first logic block and a second logic block. The first logic block may perform a logic evaluation of first input data in response to a clock signal. The first logic block may generate a first output signal. A logic level of the first output signal may be maintained while the logic evaluation is performed. The second logic block may perform a logic evaluation of second input data in response to the clock signal. The second input data may include the first output signal. The second logic block may generate a second output signal. A logic level of the second output signal may be maintained while the logic evaluation is performed.

The first logic block may include a first input circuit and a first output circuit. The first input circuit may precharge a first dynamic node at a first phase of the clock signal. The first input circuit may determine a logic level of the first dynamic node by performing a logic evaluation of input data at a second phase of the clock signal. The first output circuit may be coupled between a first output node and the first dynamic node. The first output circuit may generate the first output signal in response to the clock signal and the logic level of the first dynamic node.

The second logic block may include a second input circuit and a second output circuit. The second input circuit may precharge a second dynamic node at the first phase of the clock signal. The second input circuit may determine a logic level of the second dynamic node by performing a logic evaluation of the second input data at the second phase of the clock signal. The second output circuit may be coupled between a second output node and the second dynamic node. The second output circuit may generate the second output signal in response to the clock signal and the logic level of the second dynamic node.

The first input circuit may include a first precharge transistor configured to precharge the first dynamic node at the first phase of the clock signal, a first logic network configured to receive the first input data to determine the logic level of the first dynamic node in response to a logic level of the first input data, and a first pull down transistor configured to enable or disable the first logic network in response to the clock signal.

The first output circuit may include a first cut-off transistor and a first output maintaining circuit. The first cut-off transistor may be coupled between the first dynamic node and a first intermediate node. The first cut-off transistor may disconnect the first dynamic node and the first intermediate node at the first phase of the clock signal. The first output maintaining circuit may maintain a logic level of the first output node during a phase transition of the clock signal.

The second input circuit may include a second precharge transistor, a second logic network, and a second pull down transistor. The second precharge transistor may precharge the second dynamic node at the first phase of the clock signal. The second logic network may receive the second input data to determine the logic level of the second dynamic node in response to a logic level of the second input data. The second pull down transistor may enable or disable the second logic network in response to the clock signal.

The second output circuit may include a second cut-off transistor and a second output maintaining circuit. The second cut-off transistor may be coupled between the second dynamic node and a second intermediate node. The second cut-off transistor may disconnect the second dynamic node and the second intermediate node at the first phase of the clock signal. The second output maintaining circuit may maintain a logic level of the second output node during a phase transition of the clock signal.

In some embodiments, a pipelined domino logic circuit includes a plurality of logic blocks sequentially connected. Each of the logic blocks includes an input circuit and an output circuit. The input circuit precharges a dynamic node of the each logic block at a first phase of a clock signal. The input circuit determines a logic level of the dynamic node of the each logic block by performing a logic evaluation of input data of the each logic block at a second phase of the clock signal. The input data of the each logic block include an output signal of a previous logic block. The output circuit is coupled between an output node of the each logic block and the dynamic node of the each logic block. The output circuit determines an output signal of the each logic block in response to the clock signal and the logic level of the dynamic node of the each logic block, and provides the output signal of the each logic block to a next logic block. The output circuit maintains a logic level of the output signal of the each logic block while the logic evaluation is performed.

The input circuit may include a precharge transistor a logic network and a pull transistor. The precharge transistor may precharge the dynamic node of the each logic block at the first phase of the clock signal. The logic network may determine the logic level of the dynamic node of the each logic block in response to a logic level of the input data of the each logic block. The pull down transistor may enable or disable the logic network in response to the clock signal.

The output circuit may include a cut-off transistor and an output maintaining circuit. The cut-off transistor is coupled between the dynamic node and an intermediate node, the cut-off transistor being configured to disconnect the dynamic node and the intermediate node at the first phase of the clock signal. The output maintaining circuit may maintain a logic level of the output signal of the each logic block during a phase transition of the clock signal.

Therefore, some example embodiments can reduce switching current by maintaining the logic level of the output signal irrespective of phase transition in the clock signal. Thereby, some example embodiments can lead to reduced current consumption. Additionally, some example embodiments may reduce circuit size and prevent malfunction.

DETAILED DESCRIPTION OF EMBODIMENTS

Figure 1:
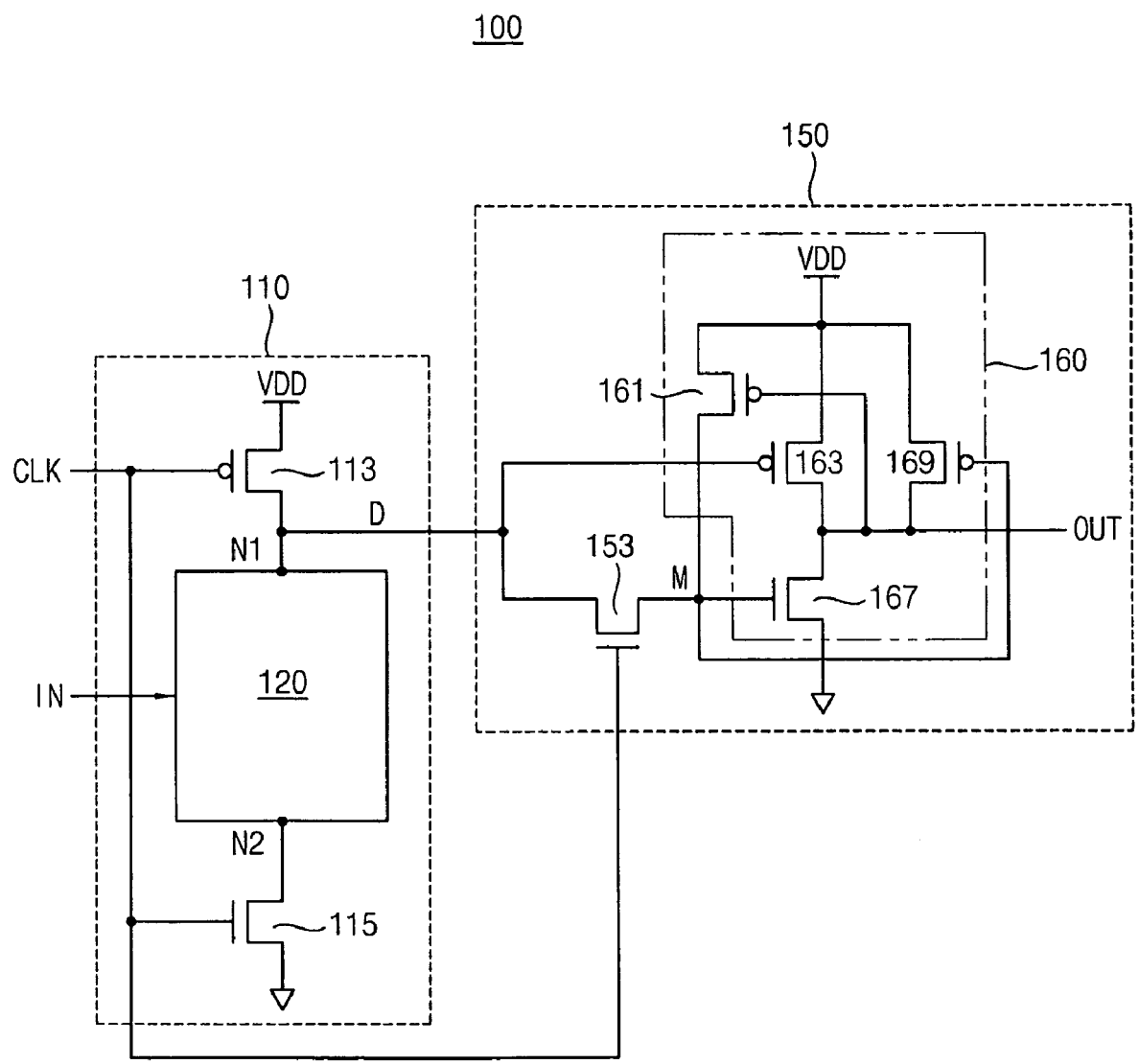
FIG. 1 illustrates a domino logic circuit according to an example embodiment.

This application claims priority under 35 USC §119 to Korean Patent Application No. 10-2008-0022317, filed on Mar. 11, 2008 in the Korean Intellectual Property Office (KIPO), the contents of which are herein incorporated by reference in their entirety.

Various example embodiments will be described more fully with reference to the accompanying drawings, in which embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a domino logic circuit according to an example embodiment.

Referring to FIG. 1, the domino logic circuit 100 includes an input circuit 110 and an output circuit 150. The input circuit 110 includes a precharge transistor 113, a logic network 120, and a pull down transistor 115. The output circuit 150 includes a cut-off transistor 153 and an output maintaining circuit 160. The output maintaining circuit 160 includes a first transistor 161, a second transistor 163, a third transistor 167 and a fourth transistor 169.

The precharge transistor 113 is coupled between a power supply voltage VDD and a dynamic node D. The precharge transistor 113 has a gate terminal that receives a clock signal CLK. The logic network 120 is coupled between the precharge transistor 113 and the pull down transistor 115. That is, the logic network 120 is coupled between a first node N1 and a second node N2. The logic network 120 receives input data IN. The input data may include a plurality of input signals. The pull down transistor 115 is coupled between the second node N2 and a ground voltage. The pull down transistor 115 has a gate terminal that receives the clock signal CLK. The precharge transistor 113 can comprise a PMOS transistor, and the pull down transistor 115 can comprise an NMOS transistor.

The cut-off transistor 153 has a first terminal coupled to the dynamic node D, a second terminal coupled to an intermediate node M, and a gate terminal that receives the clock signal CLK. The first transistor 161 has a first terminal coupled to the power supply voltage VDD, a second terminal coupled to the intermediate node M, and a gate terminal coupled to an output node O. The second transistor 163 has a first terminal coupled to the power supply voltage VDD, a second terminal coupled to the output node O, and a gate terminal coupled to the dynamic node D. The third transistor 167 has a first terminal coupled to the output node O, a second terminal coupled to the ground voltage, and a gate terminal coupled to the intermediate node M. The fourth transistor 169 has a first terminal coupled to the power supply voltage, a second terminal coupled to the output node O, and a gate terminal coupled to the intermediate node M. The first transistor 161, the second transistor 163 and the fourth transistor 169 can comprise to PMOS transistors, and the third transistor 167 can comprise an NMOS transistor.

Figure 2A:
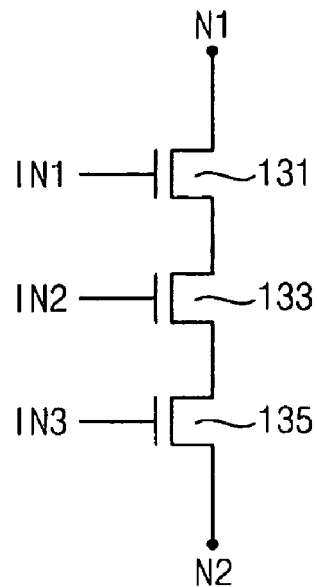
FIG. 2A and FIG. 2B illustrate examples of the logic network in FIG. 1.
Figure 2B:
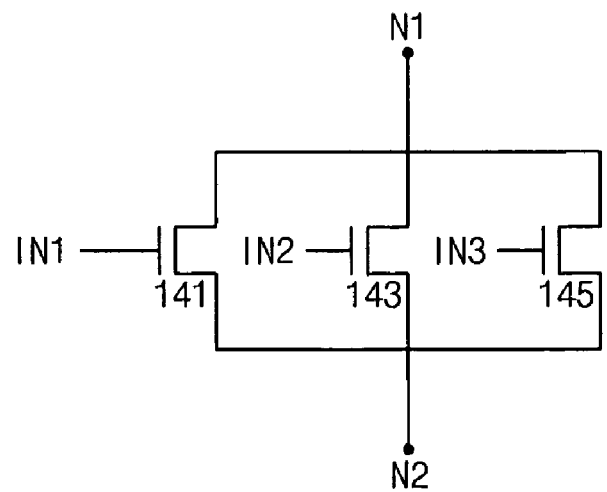

FIG. 2A and FIG. 2B illustrate examples of the logic network 120 of FIG. 1.

FIG. 2A and FIG. 2B illustrate configurations of the logic network receiving a first input signal IN1, a second input signal IN2 and a third input signal IN3.

Referring to FIG. 2A, the logic network 120 in FIG. 1 can include transistors 131, 133 and 135 serially coupled between the first node N1 and the second node N2. The gate terminals, or control terminals, of the transistors 131, 133 and 135 receive the first input signal IN1, the second the input signal IN2 and the third input signal IN3, respectively. The logic network 120 may be implemented as AND logic circuits or NAND logic circuits using the serial connection illustrated in FIG. 2A.

Referring to FIG. 2B, the logic network 120 in FIG. 1 can include transistors 141, 143 and 145 coupled in parallel between the first node N1 and the second node N2. The gate terminals of the transistors 141, 143 and 145 receives the first input signal IN1, the second input signal IN2 and the third input signal IN3, respectively. The logic network 120 may be implemented as OR logic circuits or NOR logic circuits using the parallel connection illustrated in FIG. 2B.

Figure 3:
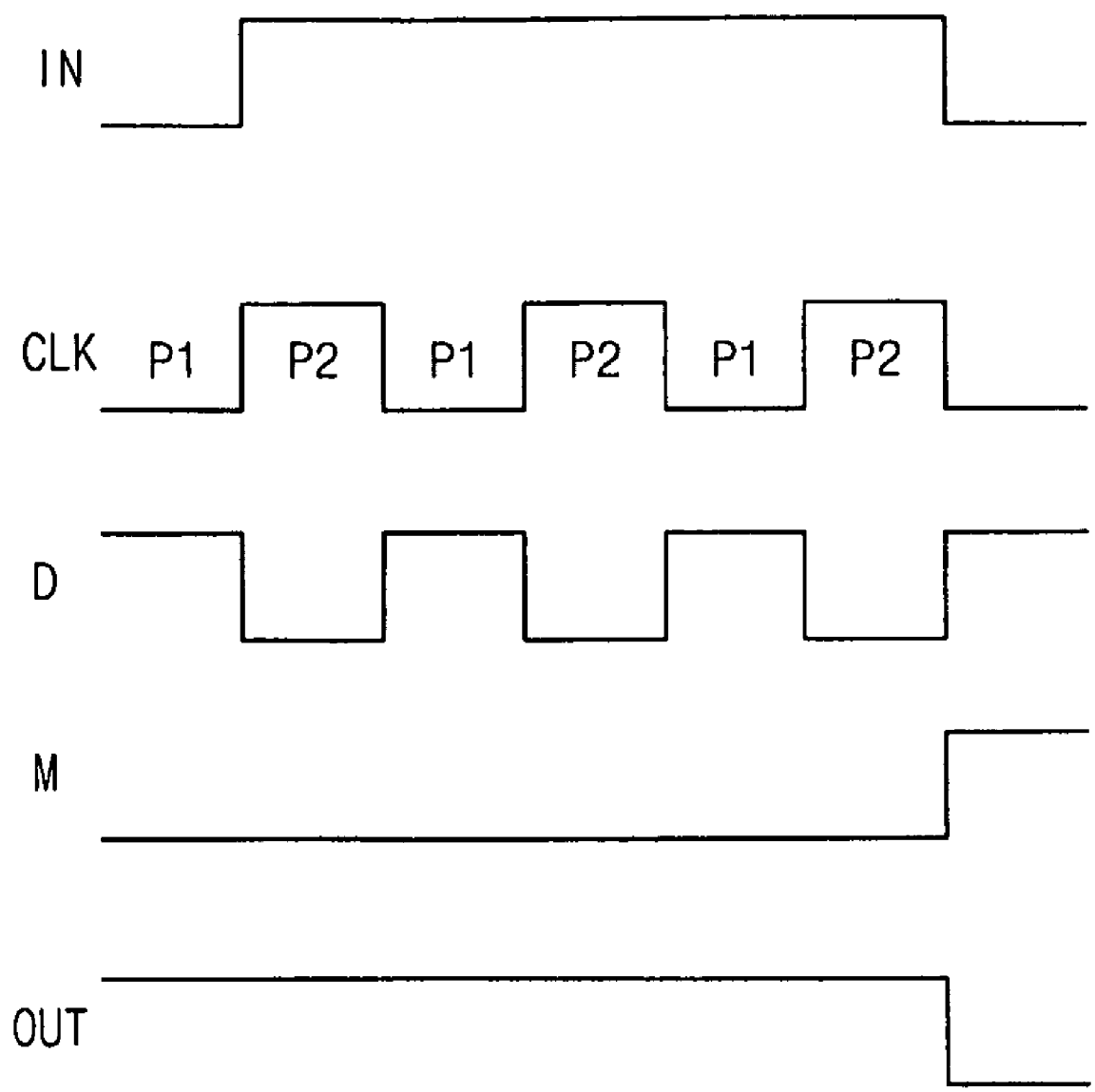
FIG. 3 is a timing diagram illustrating an operation of the domino logic circuit in FIG. 1.

FIG. 3 is a timing diagram illustrating an operation of the domino logic circuit in FIG. 1.

In FIG. 3, logic levels of the clock signal CLK, the input data IN, the dynamic node D, the intermediate node M and the output node O are illustrated. A logic level of the output signal OUT corresponds to the logic level of the output node O.

Hereinafter, the operation of the domino logic circuit 100 will be described in detail with reference to FIGS. 1-FIG. 3. It is assumed that the input data IN is maintained as a high level during a predetermined time period.

At the first phase P1, e.g., a low level, of the clock signal CLK, the precharge transistor 113 is turned on, and the dynamic node D is precharged to a level of the power supply voltage VDD. A current path of the logic network 120 receiving the input data IN is blocked because the pull down transistor 115 is turned off. In addition, a current path between the dynamic node D and the intermediate node M is blocked because the cut-off transistor 153 is turned off. Thus, a logic level of the intermediate node M is maintained at the first phase of the clock signal.

When the clock signal transitions from the first phase P1 to the second phase P2, e.g., a high level, the precharge transistor 113 is turned off, and the logic network 120 forms a current path between the first node N1 and the second node N2. The logic level of dynamic node D transitions to the low level because the pull down transistor 115 is turned on. The logic level of the intermediate node M becomes a low level as a logic level of the dynamic node D because the cut-off transistor 153 is turned on. When the logic level of the intermediate node M corresponds to a low level, the fourth transistor 169 is turned on, and the logic level of the output node O corresponds to a high level.

When the clock signal transitions from the second phase P2 to the first phase P1 again, the precharge transistor 113 is turned on, and the logic level of dynamic node D transitions to the high level again. The logic level of the intermediate node maintains the low level because the cut-off transistor 153 is turned off. Thus, the fourth transistor 169 maintains the turned-on state, and the output node O maintains the high level. That is, the output node O maintains the previous logic level even though the clock signal CLK transitions from the second phase P2 to the first phase P1. The logic level of the output node is maintained while the input data are maintained as the predetermined value.

The current path between the first node N1 and the second node N2 in the logic network 120 is blocked when the logic level of the input signal IN transitions from the high level to the low level. Thus, the logic level of the dynamic node D turns into the high level again at the first phase of the clock signal CLK. When the clock signal CLK transitions to the second phase P2 again, the cut-off transistor 153 is turned on, and the logic level of the intermediate node M becomes the high level. Thereby, the third transistor 167 is turned on, and the fourth transistor 169 is turned off. The logic level of the output node O becomes the low level by the pull down operation of the third transistor 167 when the third transistor 167 is turned on. When the logic level of the output node O becomes the low level, the first transistor 161 is turned on, and the logic level of the intermediate node M maintains the high level. Therefore, logic level of the output node O maintains the low level.

The input circuit 110 precharges the dynamic node D at the first phase P1 of the clock signal, and the input circuit 110 performs a logic evaluation of the input data IN to determine a logic level of the dynamic node. The output circuit 150 maintains the logic level of the output node O even though the phase of the clock signal CLK is changed while the logic evaluation is performed, i.e., while the logic level of the input data correspond to the high level. The pull down transistor 115 blocks or unblocks a current path formed in the logic network 120 according to the phase of the clock signal CLK. That is, the pull down transistor 115 enables or disables the logic network in response to the clock signal CLK.

The domino logic circuit 100 according to an example embodiment maintains the logic level of the output node O even though the phase of the clock signal CLK is changed while the logic evaluation is performed, i.e., while the logic level of the input data correspond to the high level. Thus, malfunction of the domino logic circuit can be prevented and excessive power consumption due to transitioning of the clock signal can be reduced.

Figure 4:
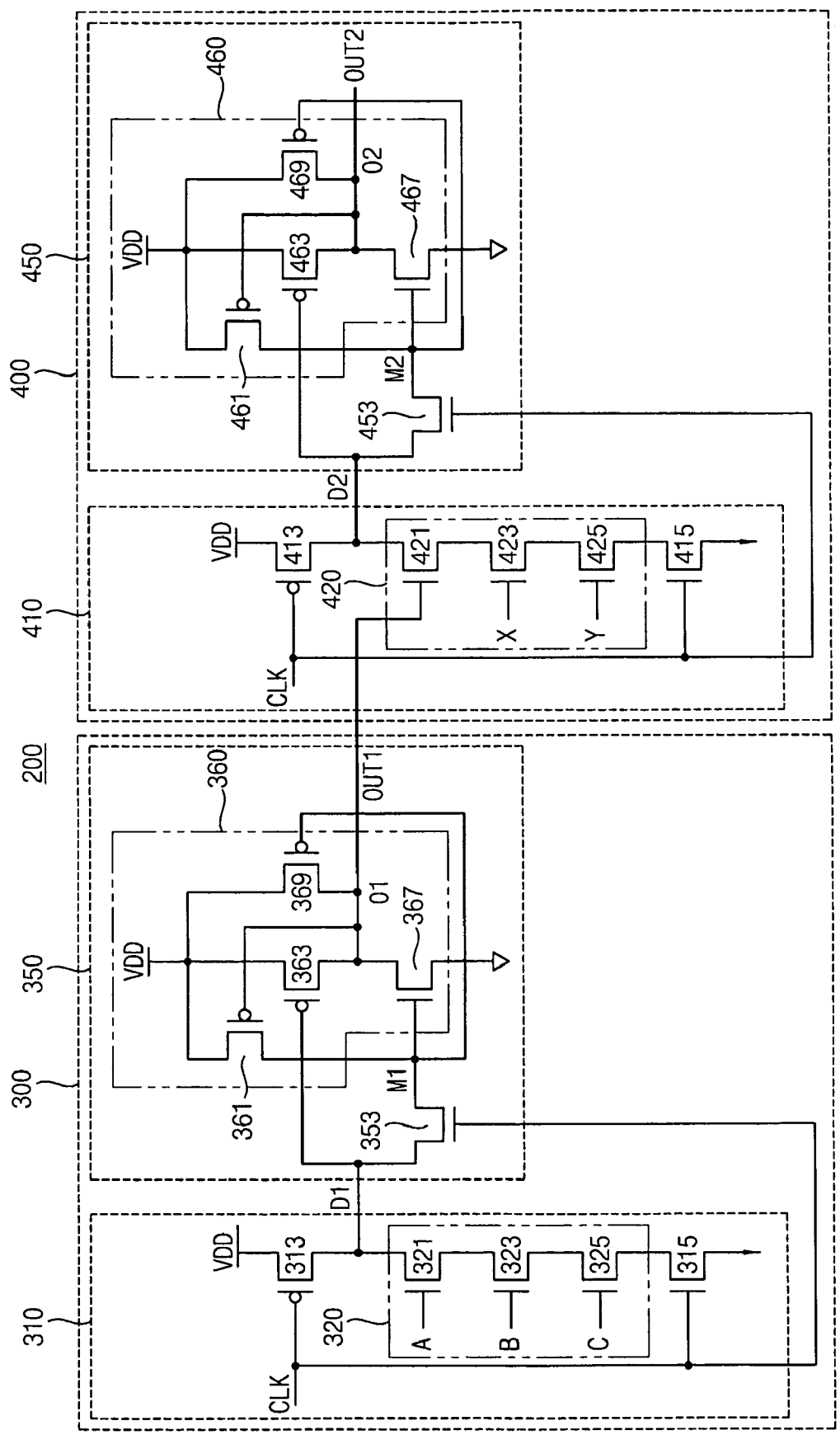
FIG. 4 illustrates a pipelined domino logic circuit according to an example embodiment.

FIG. 4 illustrates a pipelined domino logic circuit according to an example embodiment.

Referring to FIG. 4, the pipelined domino logic circuit 200 includes a first logic block 300 and a second logic block 400.

The first logic block 300 performs a logic evaluation in response to a clock signal CLK and first input data A, B and C, and generates a first output signal OUT1 that maintains a logic level while the logic evaluation is performed. The second logic block 400 performs a logic evaluation in response to the clock signal CLK and second input data OUT1, X and Y and generates a second output signal OUT2 that maintains a logic level while the logic evaluation is performed.

The first logic block 300 includes a first input circuit 310 and a first output circuit 350. The first input circuit 310 includes a first precharge transistor 313, a first logic network 320 and a first pull down transistor 315. The first logic network 320 includes a first transistor 321, a second transistor 323 and a third transistor 325 serially coupled between the first precharge transistor 313 and the first pull down transistor 315. The gate terminals of the first transistor 321, the second transistor 323 and the third transistor 325 receive input data A, B, and C respectively. The first input circuit 310 precharges a first dynamic node D1 at a first phase, e.g., a low level, of the clock signal CLK, and determines a logic level of the first dynamic node D1 by performing a logic evaluation of input data A, B and C at a second phase, e.g., a high level, of the clock signal. The first pull down transistor 315 enables or disables the first logic network 320 in response to the phase of the clock signal CLK.

The first output circuit 350 includes a first cut-off transistor 353 and a first output maintaining circuit 360. The first output maintaining circuit 360 includes a fourth transistor 361, a fifth transistor 363, a sixth transistor 365 and a seventh transistor 367. The first cut-off transistor 353 is coupled between the first dynamic node D1 and a first intermediate node M1. The first output circuit 350 is coupled between a first output node O1 and the first dynamic node. The first output circuit 350 generates the first output signal OUT1 at the first output node O1 in response to the clock signal CLK and the logic level of the first dynamic node D1.

The second logic block 400 includes a second input circuit 410 and a second output circuit 450. The second input circuit 410 includes a second precharge transistor 413, a second logic network 420 and a second pull down transistor 415. The second logic network 420 includes a eighth transistor 421, a ninth transistor 423 and a tenth transistor 425 serially coupled between the second precharge transistor 413 and the second pull down transistor 415. The gate terminals of the eighth transistor 421, the ninth transistor 423 and the tenth transistor 425 receive input data OUT1, X and Y respectively. The second input circuit 410 precharges a second dynamic node D2 at the first phase, e.g., the low level, of the clock signal CLK, and determines a logic level of the second dynamic node D2 by performing a logic evaluation of input data OUT1, X and Y at the second phase, e.g., the high level, of the clock signal CLK. The second pull down transistor 415 enables or disables the second logic network 420 in response to the phase of the clock signal CLK.

The second output circuit 450 includes a second cut-off transistor 453 and a second output maintaining circuit 460. The second output maintaining circuit 460 includes an eleventh transistor 461, a twelfth transistor 463, a thirteenth transistor 465 and a fourteenth transistor 467. The second cut-off transistor 453 is coupled between the second dynamic node D2 and a second intermediate node M2. The second output circuit 450 is coupled between a second output node O2 and the second dynamic node D2. The second output circuit 450 generates the second output signal OUT2 through the second output node O2 in response to the clock signal CLK and the logic level of the second dynamic node D2. In one embodiment, the first logic network 320 and the second logic network 420 illustrated in FIG. 4 can be implemented with AND logic circuits or NAND logic circuits. Alternatively, the first logic network 320 and the second logic network 420 can be implemented with other types of logic circuits such as OR logic circuits.

The pipelined domino logic circuit 200 may be configured by serially coupling the domino logic circuit 100 in FIG. 1. Thus, operations of individual domino logic circuits in the pipelined domino logic circuit are similar to an operation of the domino logic circuit in FIG. 1, and detailed description of the operation of the pipelined domino logic circuit 200 will be omitted.

In the pipelined domino logic circuit 200 of FIG. 4, the first output signal OUT1 of the first logic block 300 is included in the second input data provided to the second logic block 400. Therefore, the pipelined domino logic circuit 200 may perform the stable logic evaluation of the second input data, because the second input data includes a first output signal OUT1, and the logic level of the first output signal OUT1 is maintained during the phase transition of the clock signal CLK.

Figure 5:
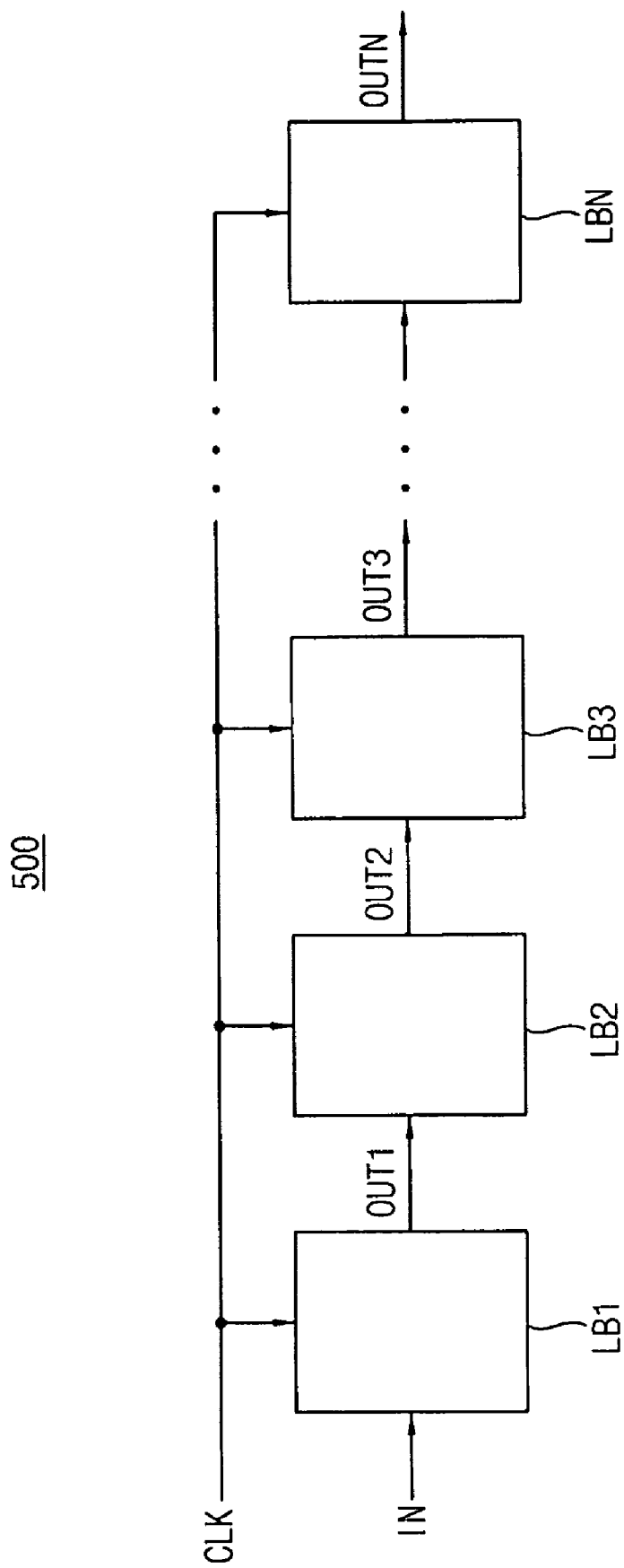
FIG. 5 illustrates a pipelined domino logic circuit according to another example embodiment.

FIG. 5 illustrates a pipelined domino logic circuit according to another example embodiment.

Referring to FIG. 5, the pipelined domino logic circuit according to another example embodiment includes a plurality of sequentially connected logic blocks LB1, LB2, . . . , LBN.

Each of the logic blocks may include the domino logic circuit 100 of FIG. 1.

Hereinafter, the operation of the pipelined domino logic circuit 500 will be described with reference to FIG. 1 and FIG. 5. In the present embodiment, it is assumed that the domino logic circuit 100 of FIG. 1 is included in a logic block LB2 of FIG. 5.

The logic block LB2 includes an input circuit 110 and an output circuit 150. The input circuit 110 precharges a dynamic node D of the present logic block LB2 at a first phase of a clock signal. The input circuit 110 determines a logic level of the dynamic node D of the logic block LB2 by performing a logic evaluation of input data of the logic block LB2 at a second phase of the clock signal. The input data of the logic block LB2 includes an output signal of the previous logic block LB1. The output circuit 150 is coupled between an output node of the logic block LB2 and the dynamic node of the logic block LB2. The output circuit 150 maintains a logic level of the output signal of the logic block LB2 while the logic evaluation is performed in response to the clock signal and the logic level of the dynamic node of the logic block LB2. The output circuit 150 provides the output signal of the logic block LB2 to a next logic block LB3.

In another embodiment, the first logic block 300 in FIG. 4 can correspond to the first logic block LB1 in FIG. 5. The second logic block 400 in FIG. 4 can correspond to one of the other logic blocks LB2 through LBN. In the pipelined domino logic circuit of FIG. 5, the output signal of each logic block is included as input data to the next logic block. Thus, a stable output signal is generated that maintains a predetermined logic level in spite of the phase transition of the clock signal.

Figure 6:
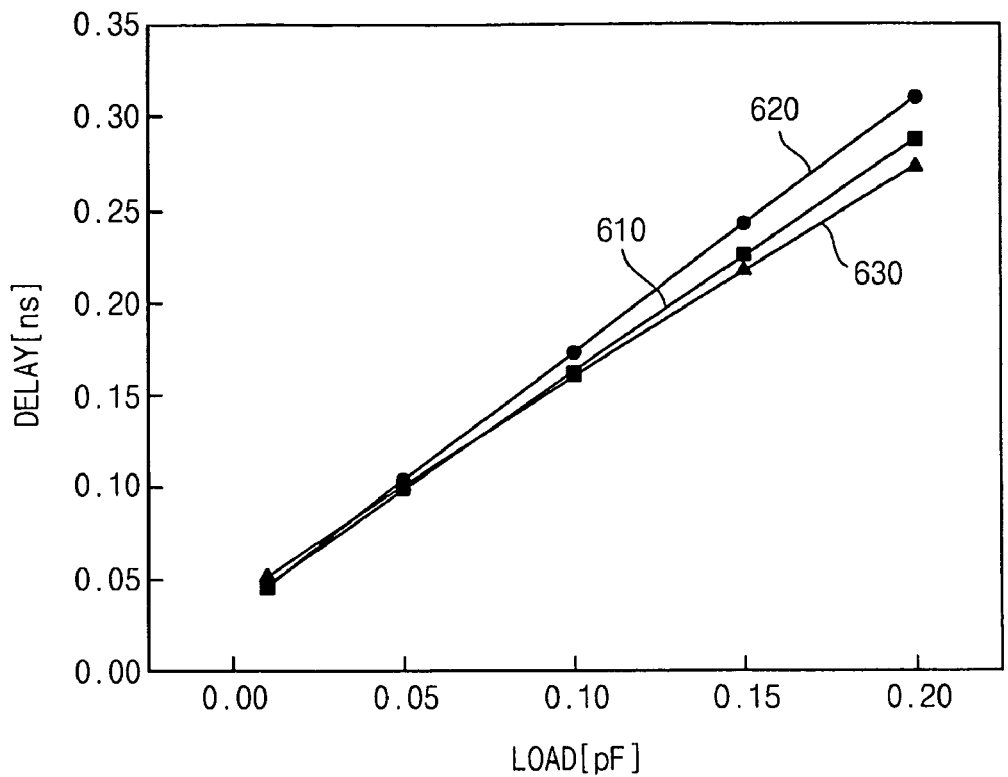
FIG. 6 is a diagram illustrating a delay speed of the domino logic circuit in FIG. 1.

FIG. 6 is a diagram illustrating a delay speed of the domino logic circuit of FIG. 1.

FIG. 6 illustrates delay speeds of the domino logic circuit 100 of FIG. 1, and that of conventional domino logic circuits. The simulated domino logic circuits have the same transistor size. The delay times are measured according to changing capacitances of load capacitors coupled to the output nodes. A delay speed of a domino logic circuit adopting the keeper transistor is illustrated with numeral 610 in FIG. 6. A delay speed of the domino logic circuit adopting the LSDL type logic circuit is illustrated with numeral 620 in FIG. 6. A delay speed of a domino logic circuit in accordance with the embodiment of FIG. 1 is illustrated with numeral 630 in FIG. 6.

As illustrated in FIG. 6, the delay speed of the domino logic circuit in accordance with the embodiment of FIG. 1 is enhanced by about three percent relative to the delay speed of the domino logic circuit adopting the keeper transistor. The delay speed of the domino logic circuit 100 in accordance with the embodiment of FIG. 1 is enhanced by about ten percent relative to the delay speed of the LSDL type domino logic circuit.

Figure 7:
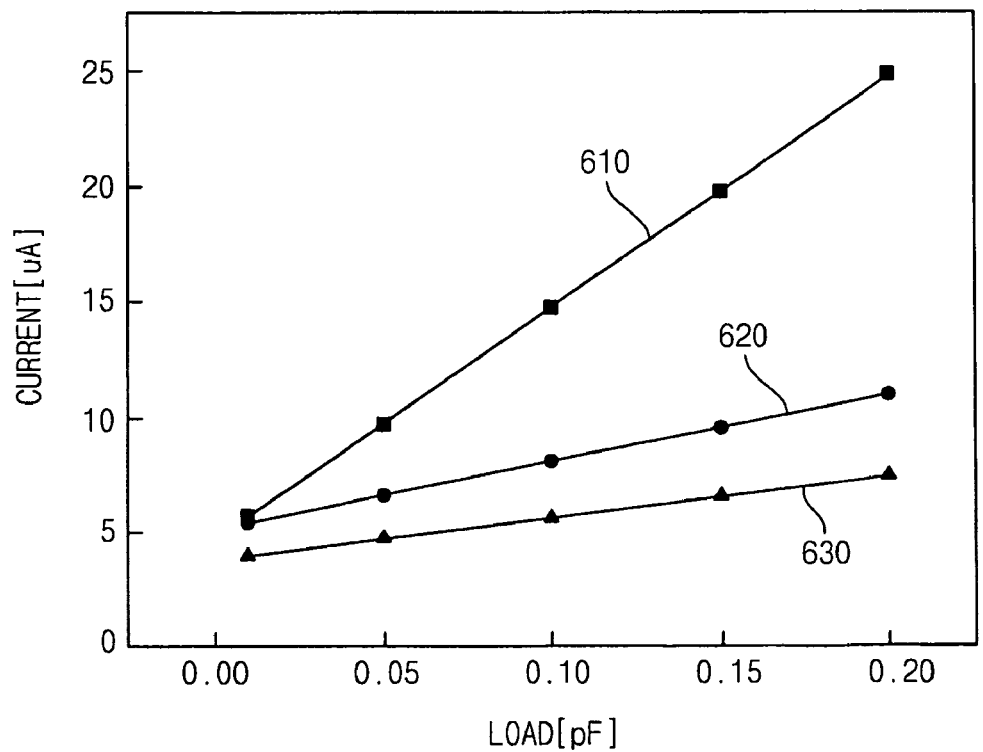
FIG. 7 is a diagram illustrating current consumptions of the domino logic circuit in FIG. 1 and conventional domino logic circuits.

FIG. 7 is a diagram illustrating current consumptions of the domino logic circuit in FIG. 1, as compared to conventional domino logic circuits. The simulation is performed under the same condition as the simulation illustrated in FIG. 6. The current of the domino logic circuit adopting the keeper transistor is illustrated with numeral 710 in FIG. 7. The current of the LSDL type logic circuit is illustrated with numeral 720 in FIG. 7. The current of the domino logic circuit adopting the domino logic circuit 100 in accordance with the embodiment of FIG. 1 is illustrated with numeral 730 in FIG. 7.

As illustrated in FIG. 7, the current consumption of the domino logic circuit in accordance with the embodiment of FIG. 1 is about sixty-five percent lower than the current consumption of the domino logic circuit adopting the keeper transistor. Also, the current consumption of the domino logic circuit 100 in accordance with the embodiment of FIG. 1 is about thirty-one percent lower than the current consumption of the LSDL type logic circuit.

According to the example embodiments, switching current can be reduced by maintaining the logic level of the output signal despite phase transitions of the clock signal. Thus, the current consumption may be reduced. In addition, a circuit size may be reduced and malfunction of the domino logic circuit may be prevented. Thus, the domino logic circuits according to the example embodiments may be applicable to high performance digital circuits which require operation at high speed with low power consumption.

While the example embodiments and their advantages have been described in detail, it should be understood that various changes, substitutions and alterations may be made herein without departing from the scope of the invention.

What is claimed is:

1. A domino logic circuit comprising:

an input circuit configured to precharge a dynamic node at a first phase of a clock signal and configured to determine a logic level of the dynamic node by performing a logic evaluation of input data at a second phase of the clock signal; and an output circuit coupled between an output node and the dynamic node, the output circuit being configured to determine a logic level of the output node in response to the clock signal and the logic level of the dynamic node and to maintain the logic level of the output node while the logic evaluation is performed, wherein the output circuit comprises:

a cut-off transistor having a first terminal coupled to the dynamic node, a second terminal coupled to an intermediate node, and a gate terminal receiving the clock signal, and a first transistor having a first terminal coupled to a power supply voltage, a second terminal coupled to the output node, and a gate terminal coupled to the dynamic node;

a second transistor having a first terminal coupled to a power supply voltage, a second terminal coupled to the intermediate node, and a gate terminal coupled to the output node;

a third transistor having a first terminal coupled to the output node, a second terminal coupled to a ground voltage, and a gate terminal coupled to the intermediate node; and a fourth transistor having a first terminal coupled to the power supply voltage, a second terminal coupled to the output node, and a gate terminal coupled to the intermediate node.

2. The domino logic circuit of claim 1, wherein the input circuit includes:
 a precharge transistor configured to precharge the dynamic node at the first phase of the clock signal;
 a logic network configured to receive the input data to determine the logic level of the dynamic node in response to a logic level of the input data; and
 a pull down transistor configured to enable or disable the logic network in response to the clock signal.

3. The domino logic circuit of claim 2, wherein the precharge transistor comprises a PMOS transistor having a source terminal coupled to a power supply voltage, a drain terminal coupled to the dynamic node, and a gate terminal receiving the clock signal, and
 wherein the pull down transistor comprises an NMOS transistor having a source terminal coupled to a ground voltage, a drain terminal coupled to the logic network, and a gate terminal receiving the clock signal.

4. The domino logic circuit of claim 3, wherein the logic network includes a plurality of transistors serially coupled to form a current path between the dynamic node and the pull down transistor, the plurality of the transistors having control terminals receiving the input data.

5. The domino logic circuit of claim 3, wherein the logic network includes a plurality of transistors coupled in parallel to form a plurality of current paths between the dynamic node and the pull down transistor, the plurality of the transistors having control terminals receiving the input data.

6. The domino logic circuit of claim 1, wherein the output circuit includes:
 the cut-off transistor coupled between the dynamic node and the intermediate node, the cut-off transistor being configured to disconnect the dynamic node and the intermediate node at the first phase of the clock signal; and
 an output maintaining circuit configured to maintain the logic level of the output node during a phase transition of the clock signal.

7. The domino logic circuit of claim 6, wherein the output maintaining circuit includes:
 the first transistor, the second transistor, the third transistor and the fourth transistor.

8. A domino logic circuit comprising:
 a precharge transistor configured to precharge a dynamic node at the first phase of a clock signal;
 a logic network coupled to the dynamic node, the logic network being configured to determine a logic level of the dynamic node by performing a logic evaluation of input data;
 a pull down transistor coupled between the logic network and a ground voltage to receive the clock signal;
 a cut-off transistor having a first terminal coupled to the dynamic node, a second terminal coupled to the intermediate node, and a gate terminal receiving the clock signal;
 a first transistor having a first terminal coupled to a power supply voltage, a second terminal coupled to the intermediate node, and a gate terminal coupled to an output node;
 a second transistor having a first terminal coupled to the power supply voltage, a second terminal coupled to the output node, and a gate terminal coupled to the dynamic node;
 a third transistor having a first terminal coupled to the output node, a second terminal coupled to the ground voltage, and a gate terminal coupled to the intermediate node; and
 a fourth transistor having a first terminal coupled to the power supply voltage, a second terminal coupled to the output node, and a gate terminal coupled to the intermediate node.

9. The domino logic circuit of claim 8, wherein a logic level of the output node is maintained while the logic evaluation of the input data is performed.

10. A pipelined domino logic circuit comprising:
 a first logic block configured to perform a logic evaluation of first input data in response to a clock signal and configured to generate a first output signal, a logic level of the first output signal being maintained while the logic evaluation is performed; and
 a second logic block configured to perform a logic evaluation of second input data in response to the clock signal, the second input data including the first output signal, the second logic block being configured to generate a second output signal, a logic level of the second output signal being maintained while the logic evaluation is performed, wherein the first logic block includes:
  a first input circuit configured to precharge a first dynamic node at a first phase of the clock signal and configured to determine a logic level of the first dynamic node by performing a logic evaluation of input data at a second phase of the clock signal; and
  a first output circuit coupled between a first output node and the first dynamic node, the first output circuit being configured to generate the first output signal in response to the clock signal and the logic level of the first dynamic node,
 wherein the first output circuit comprises:
  a first cut-off transistor having a first terminal coupled to the first dynamic node, a second terminal coupled to a first intermediate node, and a gate terminal receiving the clock signal, and
  a first transistor having a first terminal coupled to a power supply voltage, a second terminal coupled to the first output node, and a gate terminal coupled to the first dynamic node;
  a second transistor having a first terminal coupled to a power supply voltage, a second terminal coupled to the intermediate node, and a gate terminal coupled to the output node;
  a third transistor having a first terminal coupled to the output node, a second terminal coupled to a ground voltage, and a gate terminal coupled to the intermediate node; and
  a fourth transistor having a first terminal coupled to the power supply voltage, a second terminal coupled to the output node, and a gate terminal coupled to the intermediate node.

11. The pipelined domino logic circuit of claim 10, wherein the second logic block includes:
 a second input circuit configured to precharge a second dynamic node at the first phase of the clock signal and configured to determine a logic level of the second dynamic node by performing a logic evaluation of the second input data at the second phase of the clock signal; and
 a second output circuit coupled between a second output node and the second dynamic node, the second output circuit being configured to generate the second output signal in response to the clock signal and the logic level of the second dynamic node.

12. The pipelined domino logic of claim 11, wherein the first input circuit includes:
   a first precharge transistor configured to precharge the first dynamic node at the first phase of the clock signal;
   a first logic network configured to receive the first input data to determine the logic level of the first dynamic node in response to a logic level of the first input data; and
   a first pull down transistor configured to enable or disable the first logic network in response to the clock signal.

13. The pipelined domino logic of claim 12, wherein the first output circuit includes:
   the first cut-off transistor coupled between the first dynamic node and the first intermediate node, the first cut-off transistor being configured to disconnect the first dynamic node and the first intermediate node at the first phase of the clock signal; and
   a first output maintaining circuit configured to maintain a logic level of the first output node during a phase transition of the clock signal.

14. The domino logic circuit of claim 12, wherein the second input circuit includes:
   a second precharge transistor configured to precharge the second dynamic node at the first phase of the clock signal;
   a second logic network configured to receive the second input data to determine the logic level of the second dynamic node in response to a logic level of the second input data; and
   a second pull down transistor configured to enable or disable the second logic network in response to the clock signal.

15. The pipelined domino logic circuit of claim 14, wherein the second output circuit includes:
   a second cut-off transistor coupled between the second dynamic node and a second intermediate node, the second cut-off transistor being configured to disconnect the second dynamic node and the second intermediate node at the first phase of the clock signal; and
   a second output maintaining circuit configured to maintain a logic level of the second output node during a phase transition of the clock signal.

16. A pipelined domino logic circuit comprising a plurality of logic blocks sequentially connected, each logic block comprising:
   an input circuit configured to precharge a dynamic node of the each logic block at a first phase of a clock signal, the input circuit being configured to determine a logic level of the dynamic node of the each logic block by performing a logic evaluation of input data of the each logic block at a second phase of the clock signal, the input data of the each logic block including an output signal of a previous logic block; and
   an output circuit coupled between an output node of the each logic block and the dynamic node of the each logic block, the output circuit being configured to determine an output signal of the each logic block in response to the clock signal and the logic level of the dynamic node of the each logic block, and provide the output signal of the each logic block to a next logic block, the output circuit being configured to maintain a logic level of the output signal of the each logic block while the logic evaluation is performed,
   wherein the output circuit comprises:
      a cut-off transistor having a first terminal coupled to the dynamic node, a second terminal coupled to an intermediate node, and a gate terminal receiving the clock signal, and
      a first transistor having a first terminal coupled to a power supply voltage, a second terminal coupled to the output node, and a gate terminal coupled to the dynamic node;
      a second transistor having a first terminal coupled to a power supply voltage, a second terminal coupled to the intermediate node, and a gate terminal coupled to the output node;
      a third transistor having a first terminal coupled to the output node, a second terminal coupled to a ground voltage, and a gate terminal coupled to the intermediate node; and
      a fourth transistor having a first terminal coupled to the power supply voltage, a second terminal coupled to the output node, and a gate terminal coupled to the intermediate node.

17. The pipelined domino logic circuit of claim 16, wherein the input circuit includes:
   a precharge transistor configured to precharge the dynamic node of the each logic block at the first phase of the clock signal;
   a logic network configured to determine the logic level of the dynamic node of the each logic block in response to a logic level of the input data of the each logic block; and
   a pull down transistor configured to enable or disable the logic network in response to the clock signal.

18. The pipelined domino logic circuit of claim 17, wherein the output circuit includes:
   the cut-off transistor coupled between the dynamic node and the intermediate node, the cut-off transistor being configured to disconnect the dynamic node and the intermediate node at the first phase of the clock signal; and
   an output maintaining circuit configured to maintain a logic level of the output signal of the each logic block during a phase transition of the clock signal.

* * * * *